(12) United States Patent
Kato et al.

(10) Patent No.: US 8,308,527 B2
(45) Date of Patent: Nov. 13, 2012

(54) METAL FILM POLISHING PAD AND METHOD FOR POLISHING METAL FILM USING THE SAME

(75) Inventors: Mitsuru Kato, Kurashiki (JP); Hirofumi Kikuchi, Kurashiki (JP); Chihiro Okamoto, Kurashiki (JP); Shinya Kato, Kurashiki (JP)

(73) Assignee: Kuraray Co., Ltd., Kurashiki-shi (JP)

( * ) Notice: Subject to any disclaimer, the term of this patent is extended or adjusted under 35 U.S.C. 154(b) by 585 days.

(21) Appl. No.: 12/531,626

(22) PCT Filed: Mar. 19, 2008

(86) PCT No.: PCT/JP2008/055029
§ 371 (c)(1),
(2), (4) Date: Sep. 16, 2009

(87) PCT Pub. No.: WO2008/120578
PCT Pub. Date: Oct. 9, 2008

(65) Prior Publication Data
US 2010/0035521 A1 Feb. 11, 2010

(30) Foreign Application Priority Data
Mar. 20, 2007 (JP) .................................. 2007-071976

(51) Int. Cl.
*B24B 1/00* (2006.01)
*B24B 7/19* (2006.01)
*B24B 7/30* (2006.01)
(52) U.S. Cl. .......................................... 451/41; 438/692
(58) Field of Classification Search ................... 451/41; 438/692
See application file for complete search history.

(56) References Cited

U.S. PATENT DOCUMENTS

2005/0064709 A1* 3/2005 Shimomura et al. .......... 438/689
2006/0084365 A1 4/2006 Sakurai et al.

FOREIGN PATENT DOCUMENTS

| JP | 2004-343016 A | 12/2004 |
| JP | 2006-111700 A | 4/2006 |
| JP | 2006-159386 A | 6/2006 |

* cited by examiner

*Primary Examiner* — Roberts Culbert
(74) *Attorney, Agent, or Firm* — Oblon, Spivak, McClelland, Maier & Neustadt, L.L.P.

(57) ABSTRACT

The invention provides a polishing pad to polish a metal layer. The polishing pad has a storage elastic modulus at 80° C. of 200 to 900 MPa and a storage elastic modulus at 110° C. of 40 MPa or less. The invention also provides a method of polishing a metal layer using the pad.

22 Claims, No Drawings

METAL FILM POLISHING PAD AND METHOD FOR POLISHING METAL FILM USING THE SAME

TECHNICAL FIELD

The present invention relates to a polishing pad for metal layer and a method of polishing a metal layer using the same, and is useful in, for example, polishing a metal layer, such as a copper layer, on a semiconductor substrate with adequate accuracy and high polishing efficiency.

BACKGROUND OF THE INVENTION

As polishing pads for planarization (for example, Chemical Mechanical Polishing; CMP) of semiconductor wafers as substrates for making integrated circuits, composite materials of velour-like or suede-like textile and resin, or relatively soft sheets with high deformation upon compression prepared by impregnating a thermoplastic polyurethane resin into a non-woven fabric, and setting the resin in wet state, have been commonly used.

In recent years, there have been growing demands for semiconductor wafer price reduction, in addition to quality improvements for further planarization and the like in line with higher integration and multilevel interconnection. Accordingly, polishing pads are required to have higher functions such as the ability to achieve more-than-conventional planarization, to permit long use, and the like.

Although conventional polishing pads of the relatively soft non-woven fabric type have good contact with wafers and ensure good retention of polishing slurry used during polishing, their performance for planarization of the polished surface is insufficient because of the softness thereof. Moreover, polishing slurry and polishing dust produced during polishing can clog air spaces in the non-woven fabric, which is likely to cause flaws on the wafer surface. In case of clogging with polishing slurry or polishing dust, they are difficult to remove by cleaning because they have invaded deeply in the air spaces of the non-woven fabric, resulting in another problem of a shorter service life of the polishing pad.

Meanwhile, polishing pads made of polymeric foam are also available, and are commonly used for applications in need of even higher levels of planarization because they are more rigid than polishing pads of the non-woven fabric type. Additionally, polishing pads made of a polymeric foam having an independent pore structure permit relatively easy cleaning and can endure long use because polishing slurry and polishing dust do not invade deeply in their air spaces as with polishing pads of the non-woven fabric type. As such polymeric foam, foamed polyurethane is commonly used because of its excellent wear resistance.

A polishing pad made of foamed polyurethane is usually produced by grinding or slicing foamed polyurethane as appropriate. Conventionally, foamed polyurethane for polishing pads has been produced by cast foam setting using a two-pack curable polyurethane (see Patent Documents 1 to 4 and the like). However, this method encounters difficulty in uniformizing the reaction and foaming and, in addition, is subject to limitations on increasing the hardness of the foamed polyurethane obtained. Additionally, conventional polishing pads made of foamed polyurethane can sometimes undergo fluctuation in the polishing characteristics thereof, such as the flatness of the polished surface and planarization efficiency; this is attributable in part to variation in the foam structure in the starting material foamed polyurethane.

To increase planarization efficiency, an even harder polishing pad is wanted (see Non-patent Document 1); on the other hand, particularly in polishing a metal layer, such as a copper layer, on a semiconductor substrate, there is an apparently contradictory need to lower the hardness so as to reduce scratches on the wafer surface. Planarization efficiency is influenced by the hardness of the entire polishing pad, whereas the onset of scratches on the wafer surface is considered to be influenced by the localized hardness on the polishing pad surface. For this reason, it is preferable that the elastic modulus of the polishing pad at relatively low temperature be increased to ensure sufficient planarization efficiency, and that if the temperature rises due to excess friction of the polishing pad with the wafer surface, the elastic modulus of the polishing pad decline rapidly so as to prevent the occurrence of scratches on the wafer surface. However, in the case of the above-described two-pack curable polyurethane, it is difficult to rapidly change the elastic modulus by a rise in temperature; as a result, it has been difficult to reconcile an improvement of planarization efficiency and the suppression of scratches.

Meanwhile, a polishing pad consisting of a foamed polyurethane other than two-pack curable polyurethane is also available; for example, a polishing pad consisting of a polyurethane foam wherein the density is 0.5 to 1.0 $g/cm^3$, the pore size is 5 to 20 µm, and the hardness (JIS-C hardness) is 90 or more, the polyurethane foam consisting of a thermoplastic polyurethane wherein the isocyanate group-derived nitrogen atom content ratio is 6% by weight or more, and the dynamic viscoelastic modulus at 50° C. is $5 \times 10^9$ $dyn/cm^2$ or more, obtained by reacting a high-molecular diol, an organic diisocyanate and a chain elongating agent, has been proposed (see Patent Document 5). However, when using a polishing pad consisting of a thermoplastic polyurethane wherein the isocyanate-derived nitrogen atom content ratio is 6% by weight or more, it has been feared that many scratches occur on the wafer surface during wafer polishing because of excess hardness.

Patent Document 1: JP-A-2000-178374
Patent Document 2: JP-A-2000-248034
Patent Document 3: JP-A-2001-89548
Patent Document 4: JP-A-11-322878
Patent Document 5: JP-A-2002-371154
Non-patent Document 1: Masahiro Kashiwagi et al., "Science of CMP", Science Forum K.K., published on Aug. 20, 1997, p. 113-119

DISCLOSURE OF THE INVENTION

Problems to be Solved by the Invention

The present invention has been developed in view of the above-described circumstances, and is directed to providing a polishing pad that makes it possible to improve the flatness of the polished surface and planarization efficiency, with fewer scratches, particularly in polishing a metal layer formed on a semiconductor substrate and the like, and a method of polishing a metal layer using the polishing pad.

Means of Solving the Problems

As a result of investigations to accomplish the above-described object, the present inventors found that polishing pads having a particular storage elastic modulus, made of a polymeric material such as a thermoplastic polyurethane, exhibit desired characteristics, conducted further investigations, and have developed the present invention.

Accordingly, the present invention relates to:

[1] a polishing pad for metal layer having a storage elastic modulus at 80° C. of 200 to 900 MPa and a storage elastic modulus at 110° C. of 40 MPa or less,

[2] the polishing pad for metal layer of [1] above, wherein the pad comprises a resin of non-foaming structure,

[3] the polishing pad for metal layer of [1] or [2] above, wherein the pad consists of a thermoplastic polyurethane obtained by reacting a high-molecular diol, an organic diisocyanate and a chain elongating agent,

[4] the polishing pad for metal layer of [3] above, wherein the high-molecular diol contains a polytetramethylene glycol at 30 to 100% by mass,

[5] the polishing pad for metal layer of [4] above, wherein the number-average molecular weight of the polytetramethylene glycol is 1200 to 4000,

[6] the polishing pad for metal layer of any one of [3] to [5] above, wherein the chain elongating agent consists of 1,4-butanediol (BD) or consists of 1,4-cyclohexanedimethanol (CHDM) and 1,4-butanediol (BD), and the molar ratio of CHDM and BD ([CHDM molar number]/[BD molar number]) is 0/100 to 50/50,

[7] the polishing pad for metal layer of any one of [1] to [6] above, wherein the metal layer is a metal layer for wiring and/or a barrier metal layer,

[8] the polishing pad for metal layer of [7] above, wherein the metal layer for wiring is a copper layer,

[9] the polishing pad for metal layer of any one of [1] to [8] above, wherein the metal layer is a metal layer with a pattern formed thereon,

[10] a method of polishing a metal layer, wherein the method uses the pad of any one of [1] to [9] above,

[11] the method of polishing of [10] above, wherein the metal layer is a metal layer for wiring and/or a barrier metal layer,

[12] the method of polishing of [11] above, wherein the metal layer for wiring is a copper layer, and

[13] the method of polishing of any one of [10] to [12] above, wherein the metal layer is a metal layer with a pattern formed thereon.

Effect of the Invention

According to the present invention, for example, it is possible to achieve an excellent polishing rate, high polishing uniformity, and suppression of the onset of scratches in subjecting a metal layer, such as a copper layer, on a semiconductor substrate to chemical mechanical polishing.

BEST MODE FOR CARRYING OUT THE INVENTION

A polishing pad for metal layer of the present invention [hereinafter, sometimes simply referred to as "the pad"] has a storage elastic modulus at 80° C. of 200 to 900 MPa and a storage elastic modulus at 110° C. of 40 MPa or less.

If the storage elastic modulus of the pad at 80° C. is lower than 200 MPa, the pad softens in excess, so that the flatness of the polished surface decreases, and that the polishing efficiency lowers, in subjecting a metal layer, such as a copper layer, on a semiconductor substrate to chemical mechanical polishing. Meanwhile, if the storage elastic modulus of the pad at 80° C. is higher than 900 MPa, the onset of scratches on the polished surface increases in subjecting a metal layer, such as a copper layer, on a semiconductor substrate to chemical mechanical polishing. For example, from the viewpoint of the flatness of the polished surface and suppression of the onset of scratches in subjecting a metal layer, such as a copper layer, on a semiconductor substrate to chemical mechanical polishing, the storage elastic modulus of the pad at 80° C. is preferably within the range of 220 to 880 MPa, more preferably within the range of 240 to 860 MPa, and still more preferably within the range of 260 to 840 MPa; for even better polishing performance, the storage elastic modulus is particularly preferably within the range of 550 to 840 MPa.

If the storage elastic modulus of the pad at 110° C. exceeds 40 MPa, scratches on the polished surface become likely to occur due to excess hardness of the pad in the event of a temperature rise due to friction between the pad and wafer as seen in subjecting a metal layer, such as a copper layer, on a semiconductor substrate to chemical mechanical polishing. For example, from the viewpoint of suppression of the onset of scratches on the polished surface in subjecting a metal layer, such as a copper layer, on a semiconductor substrate to chemical mechanical polishing, the storage elastic modulus of the pad at 110° C. is preferably 38 MPa or less, more preferably 36 MPa or less.

A polishing pad for metal layer of the present invention can easily be produced by configuring with a polymeric material (resin) wherein the storage elastic modulus at 80° C. is 200 to 900 MPa (preferably 220 to 880 MPa, more preferably 240 to 860 MPa, still more preferably 260 to 840 MPa, and particularly preferably 550 to 840 MPa), and the storage elastic modulus at 110° C. is 40 MPa or less (preferably 38 MPa or less, more preferably 36 MPa or less). If a polishing pad for metal layer of the present invention is configured with a resin of non-foaming structure, the rigidity thereof for a pad increases, and the pad surface roughness usually decreases, so that the flatness of the polished surface can easily be improved, and this is preferable.

Furthermore, if a polishing pad for metal layer of the present invention is configured with a thermoplastic polyurethane obtained by reacting a high-molecular diol, an organic diisocyanate and a chain elongating agent, the storage elastic moduli of the pad at 80° C. and 110° C. can easily be set in a desired range, and this is preferred.

As examples of the above-described high-molecular diol, polyether diols, polyester diols, polycarbonate diols and the like can be mentioned. These high-molecular diols may be used alone, or may be used in combination of two kinds or more. In particular, a polyether diol and/or a polyester diol is preferably used. The number-average molecular weight of the high-molecular diol is preferably within the range of 1200 to 4000, more preferably within the range of 1300 to 3500. As mentioned herein, any number-average molecular weight of a high-molecular diol means a number-average molecular weight calculated on the basis of hydroxyl group value as determined according to JIS K 1557.

As examples of polyether diols, polyethylene glycol, polypropylene glycol, polytetramethylene glycol, poly(methyltetramethylene glycol), glycerin-base polyalkylene ether glycol and the like can be mentioned. These polyether diols may be used alone, or may be used in combination of two kinds or more. In particular, a polyethylene glycol and/or a polytetramethylene glycol is preferably used; a polytetramethylene glycol is more preferably used.

A polyester diol can be produced by, for example, a direct esterification reaction or ester exchange reaction of a dicarboxylic acid or an ester-forming derivative thereof, such as an ester or anhydride, and a low-molecular diol by a conventional method.

As examples of the dicarboxylic acid that constitutes the polyester diol, aliphatic dicarboxylic acids having 2 to 12 carbon atoms, such as oxalic acid, succinic acid, glutaric acid, adipic acid, pimelic acid, suberic acid, azelaic acid, sebacic acid, dodecanedicarboxylic acid, 2-methylsuccinic acid, 2-methyladipic acid, 3-methyladipic acid, 3-methylpentanedioic acid, 2-methyloctanedioic acid, 3,8-dimethyldecanedioic acid, and 3,7-dimethyldecanedioic acid; aliphatic dicarboxylic acids such as dimerized aliphatic dicarboxylic acids (dimer acids) having 14 to 48 carbon atoms, prepared by dimerizing unsaturated fatty acids obtained by fractional distillation of triglycerides, and hydrogenation products thereof (hydrogenated dimer acids); alicyclic dicarboxylic acids such as 1,4-cyclohexanedicarboxylic acid; aromatic dicarboxylic acids such as terephthalic acid, isophthalic acid and orthophthalic acid and the like can be mentioned. These dicarboxylic acids may be used alone, or may be used in combination of two kinds or more. Useful dimer acids and hydrogenated dimer acids include products of Uniqema under the trade names "PRIPOL 1004", "PRIPOL 1006", "PRIPOL 1009", and "PRIPOL 1013" and the like.

As examples of the low-molecular diols that constitutes the polyester diol, aliphatic diols such as ethylene glycol, 1,3-propanediol, 1,2-propanediol, 2-methyl-1,3-propanediol, 1,4-butanediol, neopentyl glycol, 1,5-pentanediol, 3-methyl-1,5-pentanediol, 1,6-hexanediol, 1,7-heptanediol, 1,8-octanediol, 2-methyl-1,8-octanediol, 1,9-nonanediol, and 1,10-decanediol; alicyclic diols such as cyclohexanedimethanol and cyclohexanediol and the like can be mentioned. These low-molecular diols may be used alone, or may be used in combination of two kinds or more. In particular, a diol having 6 to 12 carbon atoms is preferably used, more preferably a diol having 8 to 10 carbon atoms, and still more preferably a diol having 9 carbon atoms.

As the polycarbonate diol, one obtained by reacting a low-molecular diol and a carbonate compound such as a dialkyl carbonate, alkylene carbonate, or diaryl carbonate can be used. As the low-molecular diol that constitutes the polycarbonate diol, the low-molecular diols shown as examples of a constituent of the polyester diol above can be used. As the dialkyl carbonate, dimethyl carbonate, diethyl carbonate and the like can be mentioned. As the alkylene carbonates, ethylene carbonate and the like can be mentioned. As the diaryl carbonate, diphenyl carbonate and the like can be mentioned.

In particular, when using as the high-molecular diol one containing polytetramethylene glycol at 30 to 100% by mass, the degree of phase separation between the segment derived from the high-molecular diol and the segment derived from the organic diisocyanate and chain elongating agent in the thermoplastic polyurethane obtained becomes appropriate, making it easy to produce a thermoplastic polyurethane having a storage elastic modulus at 80° C. of 200 to 900 MPa. If the ratio of polytetramethylene glycol in the high-molecular diol is less than 30% by mass, the above-described phase separation is likely to be insufficient, and the storage elastic modulus of the obtained thermoplastic polyurethane at 80° C. tends to be smaller than 200 MPa. The ratio of polytetramethylene glycol in the high-molecular diol is more preferably within the range of 50 to 100% by mass, still more preferably within the range of 75 to 100% by mass, and particularly preferably within the range of 85 to 100% by mass.

The number-average molecular weight of the above-described polytetramethylene glycol is preferably 1200 to 4000. Thereby, the degree of phase separation between the segment derived from the high-molecular diol and the segment derived from the organic diisocyanate and chain elongating agent in the thermoplastic polyurethane obtained becomes appropriate, making it easy to set the storage elastic moduli at 80° C. and 110° C. in a desired range. The number-average molecular weight of the polytetramethylene glycol is more preferably 1300 to 3500, still more preferably 1400 to 3000, and particularly preferably 1700 to 3000.

As the above-described organic diisocyanate, any organic diisocyanate that has conventionally been used to produce an ordinary polyurethane may be used; for example, aliphatic or alicyclic diisocyanates such as ethylene diisocyanate, tetramethylene diisocyanate, pentamethylene diisocyanate, hexamethylene diisocyanate, 2,2,4-trimethylhexamethylene diisocyanate, 2,4,4-trimethylhexamethylene diisocyanate, dodecamethylene diisocyanate, isophorone diisocyanate, isopropylidene bis(4-cyclohexylisocyanate), cyclohexylmethane diisocyanate, methylcyclohexane diisocyanate, 4,4'-dicyclohexylmethane diisocyanate, lysine diisocyanate, 2,6-diisocyanatomethyl caproate, bis(2-isocyanatoethyl) fumarate, bis(2-isocyanatoethyl)carbonate, 2-isocyanatoethyl-2,6-diisocyanatohexanoate, cyclohexylene diisocyanate, methylcyclohexylene diisocyanate, and bis(2-isocyanatoethyl)-4-cyclohexene; aromatic diisocyanates such as 2,4'-diphenylmethane diisocyanate, 4,4'-diphenylmethane diisocyanate, 2,4-tolylene diisocyanate, 2,6-tolylene diisocyanate, m-phenylene diisocyanate, p-phenylene diisocyanate, m-xylylene diisocyanate, p-xylylene diisocyanate, 1,5-naphthylene diisocyanate, 4,4'-diisocyanatobiphenyl, 3,3'-dimethyl-4,4'-diisocyanatobiphenyl, 3,3'-dimethyl-4,4'-diisocyanatodiphenylmethane, chlorophenylene-2,4-diisocyanate, and tetramethylxylylene diisocyanate can be mentioned. These organic diisocyanates may be used alone, or may be used in combination of two kinds or more. In particular, from the viewpoint of the wear resistance of the pad obtained and the like, 4,4'-diphenylmethane diisocyanate is preferred.

As the above-described chain elongating agent, any chain elongating agent that has conventionally been used to produce an ordinary polyurethane can be used. As the chain elongating agent, a low-molecular compound having a molecular weight of 300 or less, and having in the molecular structure thereof two or more active hydrogen atoms capable of reacting with isocyanate groups, is preferably used; for example, diols such as ethylene glycol, diethylene glycol, 1,2-propanediol, 1,3-propanediol, 2,2-diethyl-1,3-propanediol, 1,2-butanediol, 1,3-butanediol, 2,3-butanediol, 1,4-butanediol, 1,5-pentanediol, neopentylglycol, 1,6-hexanediol, 3-methyl-1,5-pentanediol, 1,4-bis(β-hydroxyethoxy)benzene, 1,4-cyclohexanediol, cyclohexanedimethanol (1,4-cyclohexanedimethanol and the like), bis(β-hydroxyethyl) terephthalate, 1,9-nonanediol, m-xylylene glycol, and p-xylylene glycol; diamines such as ethylenediamine, trimethylenediamine, tetramethylenediamine, hexamethylenediamine, heptamethylenediamine, octamethylenediamine, nonamethylenediamine, decamethylenediamine, undecamethylenediamine, dodecamethylenediamine, 2,2,4-trimethylhexamethylenediamine, 2,4,4-trimethylhexamethylenediamine, 3-methylpentamethylenediamine, 1,2-cyclohexanediamine, 1,3-cyclohexanediamine, 1,4-cyclohexanediamine, 1,2-diaminopropane, hydrazine, xylylenediamine, isophoronediamine, piperazine, o-phenylenediamine, m-phenylenediamine, p-phenylenediamine, tolylenediamine, xylenediamine, adipic dihydrazide, isophthalic dihydrazide, 4,4'-diaminodiphenylmethane, 4,4'-diaminodiphenyl ether, 4,4'-bis(4-aminophenoxy)biphenyl, 4,4'-bis(3-aminophenoxy)biphenyl, 1,4-bis(4-aminophenoxy)benzene, 1,3-bis(4-aminophenoxy)benzene, 1,3-bis(3-aminophenoxy)benzene, 3,4'-diaminodiphenyl ether, 4,4'-diaminodiphenylsulfone, 3,4-diaminodiphenylsulfone, 3,3'-diaminodiphenylsulfone, 4,4'-methylene-bis(2-chloroaniline), 3,3'-dimethyl-4,4'-diaminobiphenyl, 4,4'-diaminodiphenylsulfide, 2,6-diaminotoluene, 2,4-diaminochlorobenzene, 1,2-diaminoanthraquinone, 1,4-diaminoanthraquinone, 3,3'-diaminobenzophenone, 3,4-diaminobenzophenone, 4,4'-diaminobenzophenone, 4,4'-diaminobibenzyl, 2,2'-diamino-1,1'-binaphthalene, 1,n-bis(4-aminophenoxy)alkanes (n is 3 to 10) such as 1,3-bis(4-aminophenoxy)alkane, 1,4-bis(4-aminophenoxy)alkane, and 1,5-bis(4-aminophenoxy)alkane, 1,2-bis[2-(4-aminophenoxy)ethoxy]ethane, 9,9-bis(4-aminophenyl)fluorene, and 4,4'-diaminobenzanilide and the like can be mentioned. These chain elongating agents may be used alone, or may be used in combination of two kinds or more.

In particular, provided that the chain elongating agent consists of 1,4-butanediol (BD), or consists of 1,4-cyclohexanedimethanol (CHDM) and 1,4-butanediol (BD), and that the CHDM/BD molar ratio ([CHDM molar number]/[BD molar number]) is 0/100 to 50/50, the degree of phase separation between the segment derived from the high-molecular diol and the segment derived from the organic diisocyanate and chain elongating agent in the thermoplastic polyurethane obtained becomes appropriate, making it easy to set the storage elastic moduli at 80° C. and 110° C. in a desired range, so that this is preferable. The CHDM/BD molar ratio is more preferably 5/95 to 45/55, and still more preferably 10/90 to 40/60.

The content ratio of isocyanate group-derived nitrogen atoms in the thermoplastic polyurethane is preferably within the range of 4.6 to 6.2% by mass, more preferably within the range of 4.8 to 6.0% by mass, and still more preferably within the range of 5.0 to 5.8% by mass, because this makes it easy to set the storage elastic moduli at 80° C. and 110° C. of the thermoplastic polyurethane obtained in a desired range.

The method of producing the thermoplastic polyurethane is not particularly limited; for example, the thermoplastic polyurethane can be produced by mixing in a molten state the above-described high-molecular diol, organic diisocyanate and chain elongating agent in a specified ratio. The mixing ratio of the ingredients is determined as appropriate, taking into account the properties, wear resistance and the like to be conferred to the thermoplastic polyurethane; it is preferable that the ingredients be used in a ratio such that isocyanate groups contained in the organic diisocyanate will be 0.95 to 1.3 mol relative to 1 mol of active hydrogen atoms contained in the high-molecular diol and chain elongating agent. If the above-described ratio of isocyanate groups is less than 0.95 mol, the mechanical strength and wear resistance of the thermoplastic polyurethane obtained decrease, which in turn tends to shorten the service life for a pad; if the ratio exceeds 1.3 mol, the productivity and storage stability of the thermoplastic polyurethane decrease, which in turn tends to make it difficult to produce a pad. For example, from the viewpoint of the mechanical strength, wear resistance, productivity, and storage stability of the thermoplastic polyurethane obtained and the like, it is more preferable that the ratio of isocyanate groups contained in the organic diisocyanate be 0.96 to 1.10 mol, still more preferably 0.97 to 1.05 mol, relative to 1 mol of active hydrogen atoms contained in the high-molecular diol and chain elongating agent.

Regarding the above-described specified ratio of high-molecular diol, organic diisocyanate and chain elongating agent, to obtain a thermoplastic polyurethane having desired properties, the ratio of the mass of the high-molecular diol and the total mass of the organic diisocyanate and chain elongating agent is preferably [mass of high-molecular diol]/[total mass of organic diisocyanate and chain elongating agent]=15/85 to 45/55, more preferably 20/80 to 40/60, still more preferably 25/75 to 35/65, and particularly preferably 27/73 to 35/65.

A polishing pad for metal layer of the present invention may comprise additives such as crosslinking agents, fillers, crosslinking promoters, crosslinking aids, softening agents, tackifiers, anti-aging agents, foaming agents, processing aids, coherence providers, inorganic fillers, organic fillers, crystal nucleating agents, heat-resistance stabilizers, weather-fastness stabilizers, antistatic agents, coloring agents, lubricants, flame retardants, flame retardation aids (antimony oxide and the like), antiblooming agents, mold release agents, thickening agents, antioxidants, and electroconductive agents. The additive content in the pad is preferably 50% by mass or less, more preferably 20% by mass or less, and still more preferably 5% by mass or less.

A polishing pad for metal layer of the present invention can be produced by forming the above-described polymeric materials such as a thermoplastic polyurethane, with additives blended therein as required, by various methods of forming such as extrusion forming, injection forming, blow forming, and calender forming, and thereafter processing the formed product into desired dimensions and shape by grinding, slicing, punching and the like as required. The pad surface may have a groove, a hole and the like made by grinding, laser application and the like. Furthermore, a polishing pad for metal layer of the present invention may be used in lamination with a material for cushion layer.

Examples of the material for cushion layer include, but are not limited to, polyurethane-impregnated non-woven fabrics currently in common use (for example, "Suba400" (manufactured by Nitta Haas Inc.)), as well as rubbers such as natural rubber, nitrile rubber, polybutadiene rubber, and silicone rubber; thermoplastic elastomers such as polyester-based thermoplastic elastomers, polyamide-based thermoplastic elastomer, and fluorine-based thermoplastic elastomer; foamed plastics; polyurethane and the like; however, polyurethane is preferred because of the ease of obtainment of flexibility and foam structure required for a cushion layer.

Although the thickness of a polishing pad for metal layer of the present invention is not particularly limited, it is preferable that the thickness be 0.3 to 5 mm, because of the stability of polishing performance and the ease of production and handling. When the pad is used in lamination with a material for cushion layer, it is preferable that the polishing layer thickness be 0.3 to 5 mm, and that the cushion layer thickness be 0.5 to 5 mm.

A polishing pad for metal layer of the present invention can be used for chemical mechanical polishing along with a publicly known polishing slurry. The polishing slurry comprises, for example, a liquid medium such as water or oil; a polishing agent such as silica, alumina, cerium oxide, zirconium oxide, or silicon carbide; and other ingredients such as bases, acids, surfactants, oxidants, reducing agents, or chelating agents. In performing chemical mechanical polishing, a lubricating oil, coolant and the like may be concurrently used along with a polishing slurry as required.

Chemical mechanical polishing can be performed by keeping in contact with each other the polished surface and the pad, via a polishing slurry, under increased pressure at constant speed, for a given length of time, using a publicly known apparatus for chemical mechanical polishing. As examples of the metal layer to be polished, a metal layer for wiring such as of copper, aluminum, or tungsten; a barrier metal layer such as of tantalum, titanium, tantalum nitride, or titanium nitride, and the like formed on a semiconductor substrate can be mentioned; the pad is particularly useful in polishing a copper or copper and barrier metal layer. It is also possible to polish a metal layer having a pattern such as a wiring pattern or dummy pattern formed thereon. Although the line-to-line pitch in the above-described pattern varies among different products, usually, the pitch is often approximately 50 nm to 100 μm.

EXAMPLES

The present invention is hereinafter described more specifically by means of the following Examples, by which, however, the invention is not limited in any way. The evaluations were made by the methods described below.

[Storage Elastic Moduli at 80° C. and 110° C.]

Injection-formed sheets 5 mm wide, 30 mm long, and 2 mm thick were prepared using the thermoplastic polyurethanes obtained in Reference Examples 1 to 6 below; each sheet was thermally treated at 90° C. for 5 hours to yield a test piece; the dynamic viscoelastic moduli thereof at 80° C. and 110° C. were measured at a frequency of 11 Hz using a dynamic viscoelasticity analyzer ("DVE Rheospectra", manufactured by Rheology Co., Ltd.), and the storage elastic moduli at the respective temperatures were determined.

[Polishing Performance]

Each of the pads obtained in Examples and Comparative Examples below was attached to the "MAT-BC15" polishing machine manufactured by MAT Inc., and the pad surface was conditioned using a diamond dresser manufactured by Allied Material Corporation (#100-80% covering ratio, 19 cm diameter, 1 kg mass) at a dresser rotation rate of 140 rpm and a platen rotation rate of 100 rpm for 1 hour, while supplying distilled water at a rate of 150 mL/minute.

Next, under conditions involving a platen rotation rate of 100 rpm, a head rotation rate of 99 rpm, and a polishing pressure of 27.6 kPa, while feeding a mixed liquid of 100 parts by mass of "PL7101", a polishing slurry manufactured by Fujimi Inc., and 3.5 parts by mass of aqueous hydrogen peroxide at a concentration of 30% by mass, at a rate of 120 mL/minute, a silicon wafer 4 inches in diameter having on the surface thereof a copper layer 1500 mm thick (a copper layer with no pattern formed thereon) was polished for 60 seconds; then, conditioning was again performed under the above-described conditions for 30 seconds. Subsequently, wafers were exchanged, and polishing and conditioning were again repeated, whereby a total of nine wafers for each pad were polished.

Next, conditioning was again performed under the above-described conditions for 30 seconds, after which a silicon wafer 4 inches in diameter having on the surface thereof a copper layer having a pattern (shape: line-and-space) formed thereon, the pattern with a convexity width of 50 μm, a concavity width of 50 μm, a pitch of 100 μm, a convexity copper layer thickness of 600 nm, and an initial step height difference between convexity and concavity of 400 nm, was polished under the same polishing conditions as those described above for 30 seconds.

Of the nine wafers having on the surface thereof a copper layer with no pattern formed thereon, the last polished wafer (the 9th wafer polished) was subjected to measurements of the copper layer thicknesses before and after polishing at 49 points on the wafer surface, and the polishing rate at each point was determined. Taking the mean of the polishing rates at the 49 points as the polishing rate, polishing uniformity was evaluated in terms of non-uniformity as calculated using the equation (1) below. The smaller the non-uniformity value is, the more uniformly polished on the wafer surface the copper layer is, and the better the polishing uniformity is.

$$\text{Non-uniformity (\%)} = (\sigma/R) \times 100 \tag{1}$$

(where σ: standard deviation of the polishing rates at the 49 points, R: mean of the polishing rates at the 49 points)

This wafer was examined for scratches using the "VK-9500" color laser microscope manufactured by Keyence Corporation, used at ×500 magnification.

The 10th polished wafer having a copper layer with a pattern formed thereon was subjected to measurements of the copper layer thicknesses of the convexity and concavity in the center thereof before and after polishing, and the polishing rate for each portion was calculated from the variations of the copper layer thicknesses of the convexity and concavity. It is preferable that the convexity polishing rate be higher, and the concavity polishing rate be lower, because wafer surface planarization is accomplished in a shorter time, with a smaller amount polished.

Reference Example 1

Production of Thermoplastic Polyurethane (PU-1)

While a polytetramethylene glycol having a number-average molecular weight of 2000 [abbreviation: PTMG2000], a polytetramethylene glycol having a number-average molecular weight of 1400 [abbreviation: PTMG1400], 1,4-cyclohexanedimethanol [abbreviation: CHDM], 1,4-butanediol [abbreviation: BD], and 4,4'-diphenylmethane diisocyanate [abbreviation: MDI], used in a ratio by mass of 17.3:12.1:6.7:12.8:51.1 for PTMG2000:PTMG1400:CHDM:BD:MDI (the molar ratio of CHDM and BD was 25/75), were continuously fed to a concentrically rotating double-screw extruding machine using a constant-displacement pump, continuous molten polymerization was performed to yield a thermoplastic polyurethane. The resulting molten thermoplastic polyurethane was continuously extruded in a strand into water, and thereafter finely cut into pellets using a pelletizer; the pellets obtained were dehumidified and dried at 70° C. for 20 hours, whereby a thermoplastic polyurethane (hereinafter, this is referred to as PU-1) was produced. The storage elastic moduli of PU-1 at 80° C. and 110° C. are shown in Table 1.

Reference Example 2

Production of Thermoplastic Polyurethane (PU-2)

While PTMG1400, CHDM, BD and MDI, used in a ratio by mass of 30.9:5.3:13.0:50.8 for PTMG1400:CHDM:BD:MDI (the molar ratio of CHDM and BD was 20/80), were continuously fed to a concentrically rotating double-screw extruding machine using a constant-displacement pump, continuous molten polymerization was performed to yield a thermoplastic polyurethane. The resulting molten thermoplastic polyurethane was continuously extruded in a strand into water, and thereafter finely cut into pellets using a pelletizer; the pellets obtained were dehumidified and dried at 70° C. for 20 hours, whereby a thermoplastic polyurethane (hereinafter, this is referred to as PU-2) was produced. The storage elastic moduli of PU-2 at 80° C. and 110° C. are shown in Table 1.

Reference Example 3

Production of Thermoplastic Polyurethane (PU-3)

While PTMG2000, CHDM, BD and MDI, used in a ratio by mass of 30.6:5.4:13.7:50.3 for PTMG2000:CHDM:BD:MDI (the molar ratio of CHDM and BD was 20/80), were continuously fed to a concentrically rotating double-screw extruding machine using a constant-displacement pump, continuous molten polymerization was performed to yield a thermoplastic polyurethane. The resulting molten thermoplastic polyurethane was continuously extruded in a strand into water, and thereafter finely cut into pellets using a pelletizer; the pellets obtained were dehumidified and dried at 70° C. for 20 hours, whereby a thermoplastic polyurethane (hereinafter, this is referred to as PU-3) was produced. The storage elastic moduli of PU-3 at 80° C. and 110° C. are shown in Table 1.

Reference Example 4

Production of Thermoplastic Polyurethane (PU-4)

While a poly(2-methyl-1,8-octamethylene-co-nonamethylene adipate) having a number-average molecular weight of 2000 [abbreviation: PNOA2000, molar ratio of nonamethylene units and 2-methyl-1,8-octamethylene units=7:3], a polyethylene glycol having a number-average molecular weight of 600 [abbreviation: PEG600], CHDM, BD and MDI, used in a ratio by mass of 31.0:5.0:2.4:13.6:48.0 for PNOA2000:PEG600:CHDM:BD:MDI (the molar ratio of CHDM and BD was 10/90), were continuously fed to a concentrically rotating double-screw extruding machine using a constant-displacement pump, continuous molten polymerization was performed to yield a thermoplastic polyurethane. The resulting molten thermoplastic polyurethane was continuously extruded in a strand into water, and thereafter finely cut into pellets using a pelletizer; the pellets obtained were dehumidified and dried at 70° C. for 20 hours, whereby a thermoplastic polyurethane (hereinafter, this is referred to as PU-4) was produced. The storage elastic moduli of PU-4 at 80° C. and 110° C. are shown in Table 1.

Reference Example 5

Production of Thermoplastic Polyurethane (PU-5)

While PTMG1400, CHDM and MDI, used in a ratio by mass of 19.0:28.3:52.7 for PTMG1400:CHDM:MDI (the molar ratio of CHDM and BD was 100/0), were continuously fed to a concentrically rotating double-screw extruding machine using a constant-displacement pump, continuous molten polymerization was performed to yield a thermoplastic polyurethane. The resulting molten thermoplastic polyurethane was continuously extruded in a strand into water, and thereafter finely cut into pellets using a pelletizer; the pellets obtained were dehumidified and dried at 70° C. for 20 hours, whereby a thermoplastic polyurethane (hereinafter, this is referred to as PU-5) was produced. The storage elastic moduli of PU-5 at 80° C. and 110° C. are shown in Table 1.

Reference Example 6

Production of Thermoplastic Polyurethane (PU-6)

While a poly(3-methyl-1,5-pentamethylene adipate)diol having a number-average molecular weight of 3600 [abbreviation: PMPA3600], CHDM, BD and MDI, used in a ratio by mass of 32.1:8.1:11.8:48.0 for PMPA3600:CHDM:BD:MDI (the molar ratio of CHDM and BD was 30/70), were continuously fed to a concentrically rotating double-screw extruding machine using a constant-displacement pump, continuous molten polymerization was performed to yield a thermoplastic polyurethane. The resulting molten thermoplastic polyurethane was continuously extruded in a strand into water, and thereafter finely cut into pellets using a pelletizer; the pellets obtained were dehumidified and dried at 70° C. for 20 hours, whereby a thermoplastic polyurethane (hereinafter, this is referred to as PU-6) was produced. The storage elastic moduli of PU-6 at 80° C. and 110° C. are shown in Table 1.

Reference Example 7

Production of Thermoplastic Polyurethane (PU-7)

While PTMG1400, CHDM and MDI, used in a ratio by mass of 20.9:27.8:51.3 for PTMG1400:CHDM:MDI (the molar ratio of CHDM and BD was 100/0), were continuously fed to a concentrically rotating double-screw extruding machine using a constant-displacement pump, continuous molten polymerization was performed to yield a thermoplastic polyurethane. The resulting molten thermoplastic polyurethane was continuously extruded in a strand into water, and thereafter finely cut into pellets using a pelletizer; the pellets obtained were dehumidified and dried at 70° C. for 20 hours, whereby a thermoplastic polyurethane (hereinafter, this is referred to as PU-7) was produced. The storage elastic moduli of PU-7 at 80° C. and 110° C. are shown in Table 1.

Reference Example 8

Production of Thermoplastic Polyurethane (PU-8)

While PTMG1400, BD and MDI, used in a ratio by mass of 25.5:18.7:55.8 for PTMG1400:BD:MDI (the molar ratio of CHDM and BD was 0/100), were continuously fed to a concentrically rotating double-screw extruding machine using a constant-displacement pump, continuous molten polymerization was performed to yield a thermoplastic polyurethane. The resulting molten thermoplastic polyurethane was continuously extruded in a strand into water, and thereafter finely cut into pellets using a pelletizer; the pellets obtained were dehumidified and dried at 70° C. for 20 hours, whereby a thermoplastic polyurethane (hereinafter, this is referred to as PU-8) was produced. The storage elastic moduli of PU-8 at 80° C. and 110° C. are shown in Table 1.

TABLE 1

| | Thermoplastic polyurethane | Ratio of polytetramethylene glycol in high-molecular diol (% by mass) | CHDM/BD (molar ratio) | Nitrogen atom content ratio (% by mass) | Storage elastic modulus (MPa) | |
|---|---|---|---|---|---|---|
| | | | | | 80° C. | 110° C. |
| Reference Example 1 | PU-1 | 100 | 25/75 | 5.7 | 802 | 14 |
| Reference Example 2 | PU-2 | 100 | 20/80 | 5.7 | 266 | 35 |
| Reference Example 3 | PU-3 | 100 | 20/80 | 5.6 | 682 | 22 |
| Reference Example 4 | PU-4 | 0 | 10/90 | 5.4 | 188 | 43 |

TABLE 1-continued

|  | Thermoplastic polyurethane | Ratio of polytetramethylene glycol in high-molecular diol (% by mass) | CHDM/BD (molar ratio) | Nitrogen atom content ratio (% by mass) | Storage elastic modulus (MPa) 80° C. | Storage elastic modulus (MPa) 110° C. |
|---|---|---|---|---|---|---|
| Reference Example 5 | PU-5 | 100 | 100/0 | 5.9 | 1080 | 153 |
| Reference Example 6 | PU-6 | 0 | 30/70 | 5.4 | 94 | 16 |
| Reference Example 7 | PU-7 | 100 | 100/0 | 5.7 | 910 | 40 |
| Reference Example 8 | PU-8 | 100 | 0/100 | 6.2 | 543 | 74 |

Example 1

PU-1 as obtained in Reference Example 1 was charged in a single-screw extrusion forming machine and extruded from a T-dice to form a sheet 2 mm thick. The surface of the sheet obtained was ground to obtain a uniform sheet 1.5 mm thick, after which grooves 2.0 mm wide and 1.0 mm deep were made at 15.0 mm intervals in a grid, and a circular pad 38 cm in diameter was prepared.

The polishing performance of the pad obtained was evaluated by the method described above; as shown in Table 2, for the wafers having a copper layer with no pattern formed thereon, both the polishing rate and polishing uniformity were good (the higher the polishing rate is, and the smaller the non-uniformity is, the better the performance is), and no scratches were observed. For the wafers having a copper layer with a pattern formed thereon, the convexity and concavity polishing rates were good (the higher the convexity polishing rate is, and the lower the concavity polishing rate is, the better the performance is).

Example 2

PU-2 as obtained in Reference Example 2 was charged in a single-screw extrusion forming machine and extruded from a T-dice to form a sheet 2 mm thick. The surface of the sheet obtained was ground to obtain a uniform sheet 1.5 mm thick, after which grooves 2.0 mm wide and 1.0 mm deep were made at 15.0 mm intervals in a grid, and a circular pad 38 cm in diameter was prepared.

The polishing performance of the pad obtained was evaluated by the method described above; as shown in Table 2, for the wafers having a copper layer with no pattern formed thereon, both the polishing rate and polishing uniformity were good (the higher the polishing rate is, and the smaller the non-uniformity is, the better the performance is), and no scratches were observed. For the wafers having a copper layer with a pattern formed thereon, the convexity and concavity polishing rates were good (the higher the convexity polishing rate is, and the lower the concavity polishing rate is, the better the performance is).

Example 3

PU-3 as obtained in Reference Example 3 was charged in a single-screw extrusion forming machine and extruded from a T-dice to form a sheet 2 mm thick. The surface of the sheet obtained was ground to obtain a uniform sheet 1.5 mm thick, after which grooves 2.0 mm wide and 1.0 mm deep were made at 15.0 mm intervals in a grid, and a circular pad 38 cm in diameter was prepared.

The polishing performance of the pad obtained was evaluated by the method described above; as shown in Table 2, for the wafers having a copper layer with no pattern formed thereon, both the polishing rate and polishing uniformity were good (the higher the polishing rate is, and the smaller the non-uniformity is, the better the performance is), and no scratches were observed. For the wafers having a copper layer with a pattern formed thereon, the convexity and concavity polishing rates were good (the higher the convexity polishing rate is, and the lower the concavity polishing rate is, the better the performance is).

Comparative Example 1

PU-4 as obtained in Reference Example 4 was charged in a single-screw extrusion forming machine and extruded from a T-dice to form a sheet 2 mm thick. The surface of the sheet obtained was ground to obtain a uniform sheet 1.5 mm thick, after which grooves 2.0 mm wide and 1.0 mm deep were made at 15.0 mm intervals in a grid, and a circular pad 38 cm in diameter was prepared.

The polishing performance of the pad obtained was evaluated by the method described above; as shown in Table 2, for the wafers having a copper layer with no pattern formed thereon, both the polishing rate and polishing uniformity were good (the higher the polishing rate is, and the smaller the non-uniformity is, the better the performance is), but a few scratches were observed. For the wafers having a copper layer with a pattern formed thereon, the convexity and concavity polishing rates were relatively good (the higher the convexity polishing rate is, and the lower the concavity polishing rate is, the better the performance is).

Comparative Example 2

PU-5 as obtained in Reference Example 5 was charged in a single-screw extrusion forming machine and extruded from a T-dice to form a sheet 2 mm thick. The surface of the sheet obtained was ground to obtain a uniform sheet 1.5 mm thick, after which grooves 2.0 mm wide and 1.0 mm deep were made at 15.0 mm intervals in a grid, and a circular pad 38 cm in diameter was prepared.

The polishing performance of the pad obtained was evaluated by the method described above; as shown in Table 2, for the wafers having a copper layer with no pattern formed thereon, both the polishing rate and polishing uniformity were good (the higher the polishing rate is, and the smaller the non-uniformity is, the better the performance is), but many scratches were observed. For the wafers having a copper layer with a pattern formed thereon, the convexity and concavity polishing rates were good (the higher the convexity polishing rate is, and the lower the concavity polishing rate is, the better the performance is).

Comparative Example 3

PU-6 as obtained in Reference Example 6 was charged in a single-screw extrusion forming machine and extruded from a T-dice to form a sheet 2 mm thick. The surface of the sheet obtained was ground to obtain a uniform sheet 1.5 mm thick, after which grooves 2.0 mm wide and 1.0 mm deep were made at 15.0 mm intervals in a grid, and a circular pad 38 cm in diameter was prepared.

The polishing performance of the pad obtained was evaluated by the method described above; as shown in Table 2, for the wafers having a copper layer with no pattern formed thereon, both the polishing rate and polishing uniformity were relatively good (the higher the polishing rate is, and the smaller the non-uniformity is, the better the performance is), and no scratches were observed. However, the wafers having a copper layer with a pattern formed thereon exhibited slightly worse performance with small ratios of convexity and concavity polishing rates, because the convexity polishing rate was relatively low, whereas the concavity polishing rate was relatively high.

Comparative Example 4

PU-7 as obtained in Reference Example 7 was charged in a single-screw extrusion forming machine and extruded from a T-dice to form a sheet 2 mm thick. The surface of the sheet obtained was ground to obtain a uniform sheet 1.5 mm thick, after which grooves 2.0 mm wide and 1.0 mm deep were made at 15.0 mm intervals in a grid, and a circular pad 38 cm in diameter was prepared.

The polishing performance of the pad obtained was evaluated by the method described above; as shown in Table 2, for the wafers having a copper layer with no pattern formed thereon, both the polishing rate and polishing uniformity were good (the higher the polishing rate is, and the smaller the non-uniformity is, the better the performance is), but some scratches were observed. For the wafers having a copper layer with a pattern formed thereon, the convexity and concavity polishing rates were good (the higher the convexity polishing rate is, and the lower the concavity polishing rate is, the better the performance is).

Comparative Example 5

PU-8 as obtained in Reference Example 8 was charged in a single-screw extrusion forming machine and extruded from a T-dice to form a sheet 2 mm thick. The surface of the sheet obtained was ground to obtain a uniform sheet 1.5 mm thick, after which grooves 2.0 mm wide and 1.0 mm deep were made at 15.0 mm intervals in a grid, and a circular pad 38 cm in diameter was prepared.

The polishing performance of the pad obtained was evaluated by the method described above; as shown in Table 2, for the wafers having a copper layer with no pattern formed thereon, both the polishing rate and polishing uniformity were good (the higher the polishing rate is, and the smaller the non-uniformity is, the better the performance is), but some scratches were observed. For the wafers having a copper layer with a pattern formed thereon, the convexity and concavity polishing rates were good (the higher the convexity polishing rate is, and the lower the concavity polishing rate is, the better the performance is).

TABLE 2

| | Thermoplastic polyurethane used | Wafer having on the surface thereof a copper layer with no pattern formed thereon | | | Wafer having on the surface thereof a copper layer with a pattern formed thereon | | |
|---|---|---|---|---|---|---|---|
| | | Polishing rate (nm/min) | Non-uniformity (%) | Scratches | Pattern convexity Polishing rate (nm/min) | Pattern concavity Polishing rate (nm/min) | Polishing rate ratio (convexity/concavity) |
| Example 1 | PU-1 | 795 | 7.1 | None | 840 | 197 | 4.26 |
| Example 2 | PU-2 | 730 | 8.1 | None | 773 | 230 | 3.36 |
| Example 3 | PU-3 | 773 | 7.6 | None | 832 | 202 | 4.12 |
| Comparative Example 1 | PU-4 | 708 | 8.3 | Few | 749 | 253 | 2.96 |
| Comparative Example 2 | PU-5 | 801 | 7.2 | Many | 842 | 185 | 4.55 |
| Comparative Example 3 | PU-6 | 678 | 9.3 | None | 721 | 298 | 2.42 |
| Comparative Example 4 | PU-7 | 788 | 7.0 | Slightly many | 851 | 173 | 4.92 |
| Comparative Example 5 | PU-8 | 720 | 7.8 | Slightly many | 797 | 210 | 3.80 |

As is evident from Table 2, in the case of Examples 1 to 3, fewer scratches occurred during wafer polishing, and the polishing rate, polishing uniformity, and flatness of the wafer having on the surface thereof a copper layer with a pattern formed thereon were good. By contrast, in the case of Comparative Examples 1 to 5, more scratches occurred during wafer polishing, or the flatness of the wafer having on the surface thereof a copper layer with a pattern formed thereon was poor.

INDUSTRIAL APPLICABILITY

According to the present invention, a polishing pad that is useful in polishing a metal layer, such as a copper layer, on a semiconductor substrate with adequate accuracy and high polishing efficiency, and a method of polishing a metal layer using the polishing pad are provided.

This application is based on a patent application No. 2007-71976 filed in Japan, the contents of which are incorporated in full herein by this reference.

The invention claimed is:

1. A polishing pad for metal layer having a storage elastic modulus at 80° C. of 200 to 900 MPa and a storage elastic modulus at 110° C. of 40 MPa or less.

2. The polishing pad for metal layer of claim 1, wherein the pad comprises a resin of non-foaming structure.

3. The polishing pad for metal layer of claim 1, wherein the pad consists of a thermoplastic polyurethane obtained by reacting a high-molecular diol, an organic diisocyanate and a chain elongating agent.

4. The polishing pad for metal layer of claim 3, wherein the high-molecular diol contains a polytetramethylene glycol at 30 to 100% by mass.

5. The polishing pad for metal layer of claim 4, wherein the number-average molecular weight of the polytetramethylene glycol is 1200 to 4000.

6. The polishing pad for metal layer of claim 3, wherein the chain elongating agent consists of 1,4-butanediol (BD) or consists of 1,4-cyclohexanedimethanol (CHDM) and 1,4-butanediol (BD), and the molar ratio of CHDM and BD ([CHDM molar number]/[BD molar number]) is 0/100 to 50/50.

7. The polishing pad for metal layer of claim 1, wherein the metal layer is a metal layer for wiring and/or a barrier metal layer.

8. The polishing pad for metal layer of claim 7, wherein the metal layer for wiring is a copper layer.

9. The polishing pad for metal layer of claim 1, wherein the metal layer is a metal layer with a pattern formed thereon.

10. A method of polishing a metal layer, wherein the method uses the pad of claim 1.

11. The method of polishing of claim 10, wherein the metal layer is a metal layer for wiring and/or a barrier metal layer.

12. The method of polishing of claim 11, wherein the metal layer for wiring is a copper layer.

13. The method of polishing of claim 10, wherein the metal layer is a metal layer with a pattern formed thereon.

14. The polishing pad for metal layer of claim 2, wherein the pad consists of a thermoplastic polyurethane obtained by reacting a high-molecular diol, an organic diisocyanate and a chain elongating agent.

15. The polishing pad for metal layer of claim 14, wherein the high-molecular diol contains a polytetramethylene glycol at 30 to 100% by mass.

16. The polishing pad for metal layer of claim 15, wherein the number-average molecular weight of the polytetramethylene glycol is 1200 to 4000.

17. The polishing pad for metal layer of claim 14, wherein the chain elongating agent consists of 1,4-butanediol (BD) or consists of 1,4-cyclohexanedimethanol (CHDM) and 1,4-butanediol (BD), and the molar ratio of CHDM and BD ([CHDM molar number]/[BD molar number]) is 0/100 to 50/50.

18. The polishing pad for metal layer of claim 2, wherein the metal layer is a metal layer with a pattern formed thereon.

19. A method of polishing a metal layer, wherein the method uses the pad of claim 2.

20. The method of polishing of claim 19, wherein the metal layer is a metal layer for wiring and/or a barrier metal layer.

21. The method of polishing of claim 20, wherein the metal layer for wiring is a copper layer.

22. The method of polishing of claim 19, wherein the metal layer is a metal layer with a pattern formed thereon.

* * * * *